United States Patent [19]

Sasa et al.

[11] Patent Number: 5,260,167
[45] Date of Patent: Nov. 9, 1993

[54] LIGHT-SENSITIVE LITHO PRINTING PLATE REQUIRING NO DAMPENING WATER

[75] Inventors: Nobumasa Sasa; Kimi Ojima; Tetsuya Taniguchi, all of Hino; Hiroshi Tomiyasu, Tama; Akeo Kasakura, Yokohama, all of Japan

[73] Assignees: Konica Corporation; Mitsubishi Kasei Corporation, both of Tokyo, Japan

[21] Appl. No.: 770,630

[22] Filed: Oct. 3, 1991

[30] Foreign Application Priority Data

Oct. 11, 1990 [JP] Japan ................. 2-272915

[51] Int. Cl.⁵ ............................. G03C 1/492
[52] U.S. Cl. ........................ 430/272; 430/303; 430/159; 430/160
[58] Field of Search ............... 430/272, 303, 159, 160

[56] References Cited

U.S. PATENT DOCUMENTS

| | | | |
|---|---|---|---|
| 4,347,303 | 8/1982 | Asano et al. | 430/272 |
| 4,826,752 | 5/1989 | Yoshida et al. | 430/272 X |
| 4,874,686 | 10/1989 | Urabe et al. | 430/272 |
| 5,126,228 | 6/1992 | Higashi et al. | 430/272 |

FOREIGN PATENT DOCUMENTS

| | | |
|---|---|---|
| 0441638 | 8/1991 | European Pat. Off. |
| 2941254 | 4/1980 | Fed. Rep. of Germany |
| 2-007049 | 1/1990 | Japan |

*Primary Examiner*—Marion E. McCamish
*Assistant Examiner*—Mark A. Chapman
*Attorney, Agent, or Firm*—Frishauf, Holtz, Goodman & Woodward

[57] ABSTRACT

Disclosed is a light-sensitive litho printing plate requiring no dampening water having a primer layer, a light-sensitive layer and a silicone rubber layer in this order on a support, characterized in that the above primer layer contains (1) an ethylenic unsaturated compound having a polymerizable unsaturated group and (2) a photopolymerization initiator, and has a tensile strength of 10 Kg/cm$^2$ or more and a Vickers hardness of 70 or less.

1 Claim, No Drawings

LIGHT-SENSITIVE LITHO PRINTING PLATE REQUIRING NO DAMPENING WATER

BACKGROUND OF THE INVENTION

This invention relates to a light-sensitive litho printing plate requiring no dampening water, more specifically to a light-sensitive litho printing plate requiring no dampening water improved in abrasion resistance of an ink repellant layer and bending resistance of a plate, and also excellent in press life.

In the prior art, as a light-sensitive litho printing plate (hereinafter called "plate material" if necessary) requiring no dampening water, one having a light-sensitive layer and an ink repellant layer provided successively by coating on a support has been known. By subjecting this plate material to exposure and development, a litho printing plate (hereinafter called "printing plate" if necessary) requiring no dampening water can be obtained.

Generally speaking, in such a plate material, for improving adhesion property between a support and a light-sensitive layer, a primer layer is provided therebetween.

For example, in Japanese Unexamined Patent Publication No. 7049/1990, there is disclosed a light-sensitive litho printing plate requiring no dampening water having a primer layer, a light-sensitive layer and an ink repellant layer on a support. However, when this plate material is processed by using an automatic processor, an ink repellant layer is rubbed by a development brush, whereby flaws are liable to be generated on this ink repellant layer, and when the printing plate was set in a printing machine, the plate is bended, whereby cracks at the bending portion and peel-off of the ink repellant layer are generated to bring about a problem that press life is lowered.

As described above, in the case of a plate material having a primer layer, flaws are liable to be generated on an ink repellant layer, and cracks at a bending portion and peel-off of an ink repellant layer are liable to be generated. When a primer layer is made elastic in order to prevent these problems, stress applied to an ink repellant layer is alleviated by a primer layer to endure this stress, whereby flaws are hardly generated.

Also at the time of bending a plate, stress from a support is alleviated similarly by a primer layer, whereby generation of cracks at the bending portion can be prevented.

SUMMARY OF THE INVENTION

In consideration of the above problems, the present inventors have prepared a primer layer so as to have a tensile strength of 10 Kg/cm$^2$ or more and a Vickers hardness of 70 or less in order to impart sufficient elasticity to the primer layer, and found that an excellent plate material free from flaws generated on a silicone rubber layer (or an ink repellant layer), cracks at a bending portion and peel-off of an ink repellant layer could be obtained, to accomplish the present invention.

That is, an object of the present invention is to provide a light-sensitive litho printing plate requiring no dampening water improved in abrasion resistance of a silicone rubber layer (an ink repellant layer) and bending resistance of a plate, and also excellent in press life.

The above object of the present invention can be accomplished by a light-sensitive litho printing plate requiring no dampening water having a primer layer, a light-sensitive layer and a silicone rubber layer (an ink repellant layer) in this order on a support, characterized in that the above primer layer contains (1) an ethylenic unsaturated compound having a polymerizable unsaturated group and (2) a photopolymerization initiator, and has a tensile strength of 10 Kg/cm$^2$ or more and a Vickers hardness of 70 or less.

DESCRIPTION OF THE PREFERRED EMBODIMENTS

In the following, the constitution of the present invention is explained more specifically.

In the present invention, a light-sensitive litho printing plate requiring no dampening water improved in abrasion resistance of a silicone rubber layer and bending resistance of a plate, and also excellent in press life can be obtained by incorporating (1) an ethylenic unsaturated compound having a polymerizable unsaturated group and (2) a photopolymerization initiator in a primer layer of a light-sensitive litho printing plate requiring no dampening water, and by making a tensile strength and a Vickers hardness of said primer layer 10 kg/cm$^2$ or more and 70 or less, respectively.

As the light-sensitive litho printing plate requiring no dampening water to be used in the present invention, there may be used a printing plate of the type of removing only a silicone rubber layer of an image portion after development, preferably a printing plate of the type removing a light-sensitive layer of an image portion and exposing a primer layer of an image portion after development.

In the method for preparing the plate material to be used in the present invention, it is required that after photosetting a primer layer provided on a support, a light-sensitive layer and a silicone rubber layer are provided successively by coating.

In the primer layer to be used in the present invention, a photopolymerizable composition containing (1) an ethylenic unsaturated compound having a polymerizable unsaturated group and (2) a photopolymerization initiator are contained.

In the following, the above materials are explained in detail.

(1) Ethylenic unsaturated compound having polymerizable unsaturated group

This ethylenic unsaturated compound having a polymerizable unsaturated group comprises a vinyl monomer having at least two terminal vinyl groups, and this vinyl monomer is disclosed in Japanese Patent Publications No. 5093/1960, No. 14719/1960 and No. 28727/1969.

There may be mentioned acrylates or methacrylates of polyols, namely diethylene glycol di(meth)acrylate, triethylene glycol di(meth)acrylate, pentaerythritol tri(meth)acrylate and trimethylolpropane tri(meth)acrylate; bis(meth)acrylamides such as methylene bis(meth)acrylamide and ethylene bis(meth)acrylamide; and unsaturated monomers containing urethane groups, for example, a reaction product of diol mono(meth)acrylate and diisocyanate, such as di-(2'-methacryloxyethyl)-2,4-tolylenediurethane and di-(2-acryloxyethyl)-trimethylenediurethane.

The (2) photopolymerization initiator may include, for example, carbonyl compounds, organic sulfur compounds, persulfides, redox type compounds, azo and diazo compounds, halogen compounds and photoreducible dyes as described in J. Kosar, "Light Sensitive Systems", Chapter 5, and is disclosed more specifically in U.K. Patent No. 1,459,563.

Further, specific examples of the photopolymerization initiator are described.

They are a benzoin derivative such as benzoin methyl ether, benzoin isopropyl ether and α,α-dimethoxy-α-phenylacetophenone; a benzophenone derivative such as benzophenone, 2,4-dichlorobenzophenone, o-benzoylmethylbenzoate, 4,4'-bis(dimethylamino)benzophenone and 4,4'-bis(diethylamino)benzophenone; a thioxanthone derivative such as 2-chlorothioxanthone and 2-isopropylthioxanthone; an anthraquinone derivative such as 2-chloroanthraquinone and 2-methylanthraquinone; an acridone derivative such as N-methylacridone and N-butylacridone; α,α-diethoxyacetophenone; benzil; fluorenone; xanthone; a uranyl compound; and a halogen compound.

In the primer layer, a binder may be contained and preferably a binder is contained therein.

Further, as a binder, there can be used various known polymers such as a polyester resin, a vinyl chloride-vinyl acetate copolymer, an acrylic resin, a vinyl chloride resin, a polyamide resin, a polyvinyl butyral resin, an epoxy resin, an acrylate type copolymer, a vinyl acetate type copolymer, a phenoxy resin, a polyurethane resin, a polycarbonate resin, polyacrylonitrile butadiene and polyvinyl acetate. The specific binders are disclosed in U.S. Pat. No. 4,072,527 in detail. These binders preferably used are a polymer containing hydroxyl group.

As the polymer containing hydroxyl group, poly(-meth)acrylic acid ester or amide containing alcoholic hydroxyl group is preferably used.

In the present invention, when an acrylic compound and a methacrylic compound are enumerated in combination, they are described as "(meth)acryl ...".

As the polymer having alcoholic hydroxyl group, there may be mentioned, for example, those having a constitutional unit(s) derived from a monomer such as 2-hydroxyethyl(meth)acrylate, N-(4-hydroxyethylphenyl)methacrylamide and hydroxy-methyldiacetone(meth)acrylamide.

The polymer having a constitutional unit derived from 2-hydroxyethyl(meth)acrylate is particularly preferred.

The above polymer containing alcoholic hydroxyl group may be a copolymer, and as a monomer for a copolymer component, there may be mentioned:

(1) a monomer having aromatic hydroxyl group, for example, N-(4-hydroxyphenyl)(meth)acrylamide, o-, m- or p-hydroxystyrene, and o-, m- or p-hydroxyphenyl(meth)acrylate, (2) an α,β-unsaturated carboxylic acid such as (meth)acrylic acid and maleic anhydride, (3) alkyl (meth)acrylates which may be substituted, such as methyl (meth)acrylate, ethyl (meth)acrylate, propyl (meth)acrylate, butyl (meth)acrylate, amyl (meth)acrylate, hexyl (meth)acrylate, octyl (meth)acrylate, 2-chloroethylacrylate, 2-hydroxyethyl (meth)acrylate, 4-hydroxybutyl (meth)acrylate, glycidyl (meth)acrylate and N-dimethylaminoethyl (meth)acrylate, (4) (meth)acrylamides which may be substituted, such as (meth)acrylamide, N-methylol (meth)acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide, (5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether, (6) vinyl esters such as vinyl acetate, vinyl chloroacetate, vinyl butyrate and vinyl benzoate, (7) styrenes such as styrene, α-methylstyrene and chloromethylstyrene, (8) vinyl ketones such as methyl vinyl ketone, ethyl vinyl ketone, propyl vinyl ketone and phenyl vinyl ketone, (9) olefins such as ethylene, propylene and isobutylene and

(10) N-vinylpyrrolidone, N-vinylcarbazole, 4-vinylpyridine, acrylonitrile and methacrylonitrile.

(3) is particularly preferred.

The amount of the monomer containing hydroxyl group in the above polymer containing hydroxyl group is not particularly limited, but preferably 5% by weight to 100% by weight, particularly preferably 20% by weight to 100% by weight.

The weight average molecular weight of the polymer containing hydroxyl group to be used in the present invention measured by the gel permeation chromatography (GPC) method is preferably 5,000 to 1,000,000 (calculated on polystyrene). If it is a value less than 5,000, the polymer may be sometimes damaged by a coating solvent or a developing solution in a light-sensitive layer even after photosetting, while if it is a value exceeding 1,000,000, it is difficult to select a coating solvent.

As to the ratios of the above ethylenic unsaturated compound and photopolymerization initiator in the primer layer, the former is generally 10% by weight to 99% by weight, preferably 20% by weight to 60% by weight, and the latter is 0.01% by weight to 20% by weight, preferably 0.1% by weight to 10% by weight.

The ratio of the above polymer containing hydroxyl group in the primer layer is generally 10% by weight to 99% by weight, preferably 40% by weight to 97% by weight.

In these photopolymerizable compositions, a thermal polymerization inhibitor, a plasticizer, a dye and a pigment may be contained.

The amounts of additives such as an ink-receiving agent, a surfactant, a sensitizer, a stabilizer, a thermal polymerization inhibitor, a plasticizer, an anchoring agent (a silane coupling agent, a silicone primer and organic titanate) and a dyestuff such as a dye and a pigment to be added to the above photopolymerizable composition may vary depending on the kind, but may be generally 0.01 to 20% by weight, preferably 0.05 to 10% by weight based on the photopolymerizable composition contained in a light-sensitive coating solution.

The thickness of the above primer layer is preferably 6 μm or more, particularly preferably 6 μm to 20 μm.

If the thickness of the primer layer is less than 6 μm, flaws may be generated on a silicone rubber layer when the silicone rubber layer is shocked by hard matters, or rubbed with cloth.

To the contrary, if it is 6 μm or more, the above shock or rubbing is alleviated by a primer layer (cushion effect) whereby flaws are hardly generated.

The primer layer to be used in the present invention preferably has a tensile strength of 10 Kg/cm$^2$ or more and a Vickers hardness of 70 or less, more preferably a tensile strength of 20 Kg/cm$^2$ or more and a Vickers hardness of 50 or less, most preferably a tensile strength of 20 to 150 Kg/cm² and a Vickers hardness of 15 to 50.

If the tensile strength of the primer layer is less than 10 Kg/cm² or the Vickers hardness exceeds 70, flaws are liable to be generated on a silicone rubber layer, and when a plate is bended, cracks are generated undesirably.

By effecting an ultraviolet ray irradiation to the photopolymerizable primer layer, a primer layer having desired tensile strength and Vickers hardness can be formed.

As a light-sensitive layer which can be used in the present invention, in the case of positive type, there may be mentioned a photopolymerizable adhesive layer or a photocross linking type light-sensitive layer and a light-sensitive layer comprising a diazo resin and a binder resin. In the case of negative type, a light-sensitive layer comprising a quinonediazide compound and a binder resin can be used.

As the above diazo resin, there may be used conventionally known various ones including a diazo resin represented by a condensate of an aromatic diazonium salt and, for example, an active carbonyl-containing compound, particularly a diazo resin represented by a condensate with formaldehyde, among them, a diazo resin soluble in an organic solvent is preferred.

As specific examples preferred as the diazo resin, there may be mentioned a resin represented by the following formula (I).

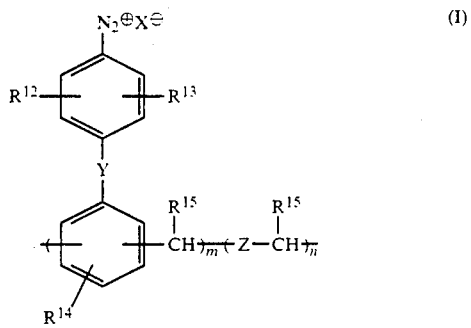

wherein $R^{12}$, $R^{13}$, $R^{14}$ each represent hydrogen atom, an alkyl group or an alkoxy group, preferably hydrogen atom; $R^{15}$ represents hydrogen atom, an alkyl group or a phenyl group, preferably hydrogen atom; X represents a counter anion of the diazo resin, specifically $PF_6$, $BF_4$, organic carboxylic acids such as decanoic acid and benzoic acid, organic phosphoric acids such as phenylphosphoric acid, and sulfonic acids such as methanesulfonic acid; Y represents NH, S or O; Z represents a phenyl group or a naphthyl group each of which is substituted by at least one substituent selected from a sulfonic acid group, a sulfonate (Na salt or K salt) group, a sulfine group, a sulfinate (Na salt or K salt) group, OH group and COOH group; and the ratio of m to n is $m/n = 1/0$ to 10, preferably a range of 1/0 to 2 in a molar ratio.

As the diazo resin represented by the above formula (I), those having a molecular weight of about 500 to 10,000 are preferred.

The amount of the diazo resin to be contained in the light-sensitive layer is preferably 1 to 70% by weight, more preferably selected from a range of 3 to 60% by weight.

In the negative-type light-sensitive litho printing plate requiring no dampening water, an orthoquinonediazide compound is used, and as said compound, there may be mentioned, for example, orthoquinonediazidesulfonate or carboxylate obtained by chemically condensing a polycondensed resin of phenols and aldehydes or ketones, and an orthoquinonediazidesulfonic acid or carboxylic acid derivative represented by the following formula (II) or formula (III).

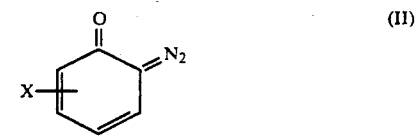

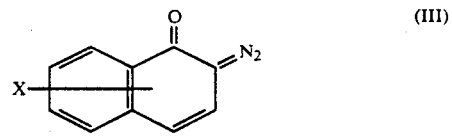

wherein X is a group represented by $-SO_2Y$ or $-COY$ where Y represents an eliminatable group at the time of condensation such as a halogen atom or an alkali metal.

Specific examples of the compound represented by the above formula (II) may include 1,2-benzoquinonediazide(2)-4-sulfonyl chloride, 1,2-benzoquinonediazide(2)-4-carbonyl chloride, 1,2-benzoquinonediazide(2)-5-sulfonyl chloride and 1,2-benzoquinonediazide(2)-5-carbonyl chloride. Specific examples of the compound represented by the formula (III) may include 1,2-naphthoquinonediazide(2)-4-sulfonyl chloride, 1,2-naphthoquinonediazide(2)-4-carbonyl chloride, 1,2-naphthoquinonediazide(2)-5-sulfonyl chloride and 1,2-naphthoquinonediazide(2)-5-carbonyl chloride.

As the polycondensed resin of phenols and aldehydes or ketones, there may be mentioned, for example, a polycondensate of pyrogallol and acetone as disclosed in Japanese Patent Publication No. 28403/1968, a polycondensate of a mixture of pyrogallol and resorcin, with acetone as disclosed in Japanese Unexamined Patent Publication No. 76346/1980, a phenol.formaldehyde.novolak resin or a metacresol.formaldehyde.novolak resin as disclosed in Japanese Patent Publication No. 9610/1970, a para-substituted phenol.formalin resin (e.g. a paracresol.formalin resin, a para-t-butylphenol.formalin resin, a paraethylphenol.formalin resin, a parapropylphenol formalin resin, a paraisopropylphenol formalin resin, a para-n-butylphenol formalin resin and a paraoctylphenol formalin resin) as disclosed in Japanese Patent Publication No. 5083/1975, and a polycondensate of a phenol mixture containing phenol substituted by an alkyl group having 3 to 12 carbon atoms or a phenyl group and phenol or a methyl-substituted phenol, or a mixture of these in a molar ratio of 1:9 to 9:1 with formaldehyde (e.g. a polycondensate of the above para-substituted phenol and phenol, paracresol or metacresol) as disclosed in Japanese Patent Publication No. 60407/1987.

The esterification ratio of an orthoquinonediazide group to hydroxyl group of the polycondensate of phenols and aldehydes or ketones is preferably 15 to 100 mole %, more preferably 20 to 80 mole %.

Further, as the orthoquinonediazide compound, there may be mentioned orthonaphthoquinonediazidesulfonate of polyhydroxybenzophenone (e.g. 1,2-naphthoquinonediazide(2)-5-sulfonate and 1,2-naphthoquinonediazide(2)-4-sulfonate).

This polyhydroxybenzophenone is a compound obtained by substituting hydroxyl groups for two or more hydrogen atoms of benzophenone, and may be mentioned, for example, dihydroxybenzophenone, trihydroxybenzophenone, tetrahydroxybenzophenone, pentahydroxybenzophenone, octahydroxybenzophenone or derivatives thereof (e.g. substituted by a halogen atom, an alkyl group, an aryl group, an aralkyl group or a carboxylic acid group), preferably trihydroxybenzophenone or tetrahydroxybenzophenone, more preferably 2,3,4-trihydroxybenzophenone or 2,3,4,4'-tetrahydroxybenzophenone.

The esterification ratio to hydroxyl group is preferably 30 to 100%.

In the present invention, the above compounds may be used singly or in combination of two or more kinds as the orthoquinonediazide compound, respectively.

Among these orthoquinonediazide compounds described above, there may be more preferably used 1,2-naphthoquinonediazide(2)-5-sulfonate or 1,2-naphthoquinonediazide(2)-4-sulfonate of 2,3,4-trihydroxybenzophenone, 1,2-naphthoquinonediazide(2)-5-sulfonate or 1,2-naphthoquinonediazide-(2)-4-sulfonate of a metacresol formaldehyde.novolak resin, or a mixture of these.

The rate of the above orthoquinonediazide compound in the light-sensitive layer is preferably 5 to 60% by weight, more preferably 20 to 50% by weight.

As a binder resin to be used in the above light-sensitive layer, there may be mentioned an acrylic resin and a novolak resin. As a copolymer constituting component of the acrylic resin, there can be used all copolymerizable monomers, and particularly as a monomer for radical polymerization, there may be used the following compounds having an unsaturated bonding.

(1) Monomers having hydroxyl group: (meth)acrylate monomers such as 2-hydroxyethyl (meth)acrylate, 2-hydroxypropyl(meth)acrylate, 2-hydroxypentyl (meth)acrylate, 4-hydroxyphenyl (meth)acrylate and 2-hydroxyphenyl (meth)acrylate; (meth)acrylamide monomers such as N-methylol (meth)acrylamide, N-hydroxyethyl (meth)acrylamide, N-(hydroxyphenyl) (meth)acrylamide and N-(hydroxynaphthyl) (meth)acrylamide; and an o-, m- or p-hydroxystyrene monomer, (2) (Meth)acrylate or (meth)acrylamide monomers other than (1): alkyl (meth)acrylates such as methyl (meth)acrylate, ethyl (meth)acrylate, propyl (meth)acrylate and butyl (meth)acrylate; N-phenyl (meth)acrylamide; o-, m- or p-methoxyphenyl (meth)acrylamide; and o-, m- or p-ethoxyphenyl (meth)acrylamide, (3) Monomers having cyano group in the side chain: (meth)acrylonitrile, 2-pentenitrile, 2-methyl-3-butenenitrile, 2-cyanoethylacrylate, and o-, m- or p-cyanostyrene, (4) Monomers having carboxylic acid in the side chain: (meth)acrylic acid, itaconic acid and an anhydride thereof, maleic acid and an anhydride thereof, and crotonic acid, (5) Vinyl ethers: propyl vinyl ether, butyl vinyl ether, octyl vinyl ether and phenyl vinyl ether, (6) Styrenes: α-methylstyrene, methylstyrene, chloromethylstyrene and styrene, (7) Vinyl ketones: methyl vinyl ketone, ethyl vinyl ketone and propyl vinyl ketone, and (8) Monomers other than (1) to (7): olefins such as ethylene, propylene, isobutylene, butadiene and vinyl chloride; N-vinylpyrrolidone, N-vinylcarbazole and 4-vinylpyridine may be mentioned, and in addition to these, monomers which can cause radical copolymerization with these monomers may be also included.

In the present invention, in either positive type or negative type, a dye, a pigment, a coatability improving agent, a plasticizer, an ink-receiving agent and a stabilizer other than the respective materials as described above can be added in the light-sensitive layer, if necessary. In the light-sensitive layer of the positive-type light-sensitive litho printing plate requiring no dampening water, a known exposure visible image imparting agent is advantageously contained.

As the above dye, there may be mentioned, for example, triphenylmethane type, diphenylmethane type, oxazine type, xanthene type, iminonaphthoquinone type, azomethine type or anthraquinone type dyes represented by Victoria Pure Blue BOH, Oil Blue #603, Oil Pink #312, Patent Pure Blue, Crystal Violet, Leuco Crystal Violet, Brilliant Green, Ethyl Violet, Methyl Green, Erythrosine B, Basic Fuchsine, Malachite Green, Leuco Malachite Green, m-Cresol Purple, Cresol Red, Xylenol Blue, Rhodamine B, Auramine, 4-p-diethylaminophenyliminonaphthoquinone and cyano-p-diethylaminophenylacetanilide.

The dye is contained in the light-sensitive layer generally in an amount of about 0.01 to about 10% by weight, preferably about 0.05 to 8% by weight.

As the coatability improving agent, there may be mentioned alkyl ethers (e.g. ethyl cellulose and methyl cellulose), fluorine type surfactants and nonionic surfactants (e.g. Pulronick L64 (trade name, produced by Asahi Denka K. K.)).

As the plasticizer for imparting flexibility and abrasion resistance of a coated film, there may be mentioned, for example, an oligomer of butyl phthalyl, polyethylene glycol, tributyl citrate, diethyl phthalate, dibutyl phthalate, dihexyl phthalate, dioctyl phthalate, tricresyl phosphate, bributyl phosphate, trioctyl phosphate, tetrahydrofulfuryl oleate, acrylic acid or methacrylic acid.

The amounts of these additives to be added may vary depending on the purpose of use, but may be preferably 0.01% by weight to 30% by weight based on total solid components in general.

The film thickness of the light-sensitive layer to be used in the present invention is generally 0.2 to 100 μm, preferably 0.5 to 20 μm.

In a light-sensitive composition containing a polymer compound having

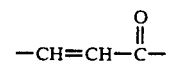

group in the main chain or the side chain of a polymer, as such a polymer compound, there may be mentioned those mainly composed of a light-sensitive polymer such as polyesters, polyamides and polycarbonates containing

as a light-sensitive group in the main chain or the side chain of a polymer (e.g. compounds as disclosed in U.S. Pat. Nos. 3,030,208, 3,707,373 and 3,453,237); those mainly composed of light-sensitive polyesters derived from a (2-properidene)malonic acid compound such as cinnamylidene malonic acid and difunctional glycols (e.g. light-sensitive polymers as disclosed in U.S. Pat. Nos. 2,956,878 and 3,173,787); and cinnamic acid esters of polymers containing hydroxyl group such as polyvinyl alcohol, starch, cellulose and analogs thereof (e.g. light-sensitive polymers as disclosed in U.S. Pat. Nos. 2,690,966, 2,752,372 and 2,732,301).

In these light-sensitive compositions, other sensitizers, stabilizers, plasticizers, pigments and dyes can be contained.

The photopolymerizable composition comprising an addition polymerizable unsaturated compound may preferably comprise (a) a vinyl monomer having at least two terminal vinyl groups, (b) a photopolymerization initiator and (c) a polymer compound as a binder.

The vinyl monomers of the component (a) are disclosed in Japanese Patent Publications No. 5093/1960, No. 14719/1960 and No. 28727/1969, and may include acrylates or methacrylates of polyols, namely diethylene glycol di(meth)acrylate, triethylene glycol di(meth)acrylate, pentaerythritol tri(meth)acrylate and trimethylolpropane tri(meth)acrylate; bis(meth)acrylamides such as methylene bis(meth)acrylamide and ethylene bis(meth)acrylamide; or unsaturated monomers containing urethane group, for example, a reaction product of a diol mono(meth)acrylate such as di-(2'-methacryloxyethyl)-2,4-tolylenediurethane and di-(2-acryloxyethyl)trimethylenediurethane, and diisocyanate.

As the photopolymerization initiator of the above component (b), the compound represented by the above formula (I) can be used, but other kinds of compounds can be also used. For example, they are carbonyl compounds, organic sulfur compounds, persulfides, redox type compounds, azo and diazo compounds, halogen compounds and photoreducible dyes as described in the above J. Kosar, "Light Sensitive Systems", Chapter 5, and disclosed more specifically in U.K. Patent No. 1,459,563.

Further, as the binder of the component (c), various known polymers can be used. The specific binders are described in U.S. Pat. No. 4,072,527 in detail.

In these photopolymerizable compositions, a thermal polymerization inhibitor, a plasticizer, and the above dye and pigment may be contained.

The amounts of additives such as an ink-receiving agent, a surfactant, a sensitizer, a stabilizer, a thermal polymerization inhibitor, a plasticizer and a dyestuff such as a dye and a pigment to be added to the above light-sensitive composition may vary depending on the kind, but may be generally 0.01 to 20% by weight, preferably 0.05 to 10% by weight based on the light-sensitive composition contained in a light-sensitive coating solution.

In the present invention, a silicone rubber layer is provided on a light-sensitive layer by coating. As a silicone rubber to be used in the silicone rubber layer of the present invention, polyorganosiloxanes which are linear type or crosslinded to a certain extent are preferred.

Said polyorganosiloxanes generally have a molecular weight of 1,000 to several hundred thousands, and at normal temperature, they are crosslinked suitably in the state of liquid, wax or rice cake.

Said polyorganosiloxanes can be classified into a condensation type and an addition type according to a crosslinking method.

In the case of the condensation type, crosslinking is effected by condensation reaction, and water, alcohol and an organic acid are released by the reaction. As the condensation type silicone rubber which is particularly useful, there may be mentioned a mixture of a linear polyorganosiloxane having hydroxyl group or acetoxy group at the both ends of the main chain or partially thereof, and a silicone crosslinking agent, or the one obtained by reacting hydroxyl group with a silicone crosslinking agent, and in either of them, a condensation catalyst is advantageously added in the point of crosslinking ratio.

The main chain of the above polyorganosiloxane has a recurring unit shown below.

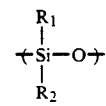

In the formula, $R_1$ and $R_2$ each represent an alkyl group, an aryl group or an alkenyl group each of which may have a substituent or a combination thereof, preferably methyl group, phenyl group, vinyl group and trifluoropropyl group, particularly preferably methyl group.

As the above silicone crosslinking agent, there may be mentioned silicone crosslinking agents of the so-called condensation type such as deacetic acid type, deoximation type, dealcoholation type, deamination type and dehydration type, having a functional group represented by

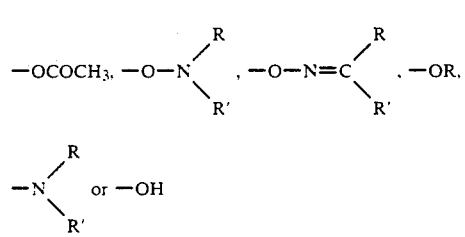

where R and R' each represent an alkyl group. As an example of such a crosslinking agent, there may be mentioned tetraacetoxysilane, methyltriacetoxysilane, ethyltriacetoxysilane, phenyltriacetoxysilane, dimethyldiacetoxysilane, diethyldiacetoxysilane, vinyltriacetoxysilane, methyltrimethoxysilane, dimethyldimethoxysilane, vinyltrimethoxysilane, methyltris(acetoneoxime)silane, methyltri(N-methyl-N-acetylamino)silane, vinyltri(methylethylketoxime)silane, methyltri(methylethylketoxime)silane or oligomers thereof.

These crosslinking agents may be used in a range of 0.5 to 30 parts by weight based on 100 parts by weight of polyorganosiloxane, respectively.

The above condensation catalyst may include an organic carboxylic acid, titanate, an acetylacetone metal complex, chloroplatinic acid and naphthenic acid.

The addition type refers to one in which an aqueous group in a crosslinking agent is added to an unsaturated group, for example, vinyl group ($-CH=CH_2$) in the main body to effect crosslinking.

As a specific example, there may be mentioned organopolysiloxane containing vinyl group or hydrogenated organopolysiloxane mixed with a platinic catalyst (e.g. chloroplatinic acid).

Said polyorganosiloxanes have the same recurring unit as that of the above condensation type in the main chain.

In the silicone rubber layer of the present invention, either or both of the condensation type and/or addition type silicone rubbers can be used.

Further, a condensation and addition type rubber having hydroxyl group and an unsaturated group in one polyorganosiloxane molecule can be used.

In the present invention, an adhesive layer comprising an acrylic resin may be provided between the light-sensitive layer and the silicone rubber layer. In the adhesive layer, various reactive crosslinking agents and silane coupling agents may be contained, and the thickness of the adhesive layer is preferably 0.1 mg/dm² to 5 mg/dm².

As the support which can be used in the present invention, any support can be used as long as it has bending characteristic capable of being set in a common litho printing machine and can endure load applied during printing, and it is not particularly limited including a layer constitution thereof. For example, there may be included papers such as a coated paper, a metal plate such as an aluminum plate (H-16 and H-18 according to JIS standard) or a plastic film such as polyethylene terephthalate.

An aluminum plate or a composite material of aluminum foil and others is preferred, and an aluminum plate is particularly preferred in the point of press life.

As to the surface roughness of the aluminum plate, the center line average roughness is Ra ≦ 1 μm, preferably 0.5 μm or less, whereby press life becomes good.

Here, the center line average roughness (Ra) refers to an arithmetic mean of absolute values of distances from a center line in roughness profile to the respective points on said profile as shown in German standard DIN4768, namely an Ra value of a measured length of m determined by the following formula represented by a micron unit when the center line in the lateral direction is an X axis and the points on the roughness profile are represented by (x, y).

$$Ra = \frac{1}{lm} \int_0^{lm} |y| dx$$

From the standpoint of storage stability, the support to be used, particularly the aluminum plate or the composite material of aluminum foil and others may be subjected to surface treatment according to the known method.

As such a surface treatment, there may be included, for example, a method of treating the surface of an aluminum plate with silicate (U.S. Pat. No. 2,714,066), a method of treating with an organic acid salt (U.S. Patent No. 2,714,066), a method of treating with phosphonic acid and a derivative thereof (U.S. Pat. No. 3,220,832), a method of treating with potassium hexafluorozirconate (U.S. Pat. No. 2,946,683), and an anodizing method and a method of treating with an aqueous solution of an alkali metal silicate after anodization (U.S. Pat. No. 3,181,461).

On such a support, for obtaining sufficient adhesive property between the light-sensitive layer and the support, the primer layer is provided as mentioned above, and then the light-sensitive layer is provided thereon.

The thicknesses of the respective layers constituting the plate material of the present invention are described below. That is, the support has a thickness of 50 to 400 μm, preferably 100 to 300 μm, the light-sensitive layer 0.05 to 10 μm, preferably 0.1 to 1.0 μm, and the silicone rubber layer 0.5 to 100 μm, preferably 1 to 4 μm. The primer layer has a thickness of 0.1 to 20 μm, preferably 0.3 to 10 μm.

In the present invention, the silicone rubber layer may also have a protective layer on its upper surface, if necessary.

As a material of this protective layer, there may be preferably used a water-soluble film such as polyvinyl alcohol or a biodegradable film such as polyhydroxyalkanoate and polyesteramide.

The plate material requiring no dampening water of the present invention can be prepared, for example, as described below.

On a support, a composition solution constituting for the primer layer is coated by using a conventional coater such as a reverse roll coater, an air knife coater and a Meyer bar coater, or a rotary coating device such as a wheeler, followed by drying, to effect curing by crosslinking. Subsequently, a composition solution constituting for the light-sensitive layer is coated and dried.

A silicone rubber solution is coated on the above light-sensitive layer in the same manner as mentioned above and subjected to heat treatment generally at a temperature of 100° to 120° C. for several minutes to be sufficiently cured, thereby forming a silicone rubber layer. If necessary, a protective film may be provided on said silicone rubber layer by using a laminator.

Next, the method for preparing the printing plate requiring no dampening water by using the plate material requiring no dampening water of the present invention is described.

A positive film which is an original copy or manuscript is vacuum adhered on the surface of a positive-type plate material, and subjected to exposure. As a light source for this exposure, there may be used a mercury lamp, a carbon arc lamp, a xenon lamp, a metal halide lamp and a fluorescent lamp which generate UV rays abundantly.

Subsequently, the positive film is peeled off and the plate material is developed by using a developing solution. As the developing solution, those known as a developing solution for the plate material requiring no dampening water can be utilized, but an aqueous developing solution is preferably used.

The aqueous developing solution refers to a developing solution mainly composed of water including, for example, a developing solution containing 30% by weight or more, preferably 50% by weight to 98% by weight of water, an organic solvent and a surfactant disclosed in Japanese Unexamined Patent Publication No. 275759/1986, more preferably further containing an alkali agent.

As the organic solvent to be contained in the developing solution mainly composed of water, there may be mentioned, for example, aliphatic hydrocarbons (hexane, heptane and "Isopar E, H or G" (trade names of aliphatic hydrocarbons, produced by Esso Chemical), gasoline or kerosene), aromatic hydrocarbons (toluene and xylene) or halogenated hydrocarbons (triclene); and alcohols (methanol, ethanol, 1-butoxy-2-propanol, 3-methyl-3-methoxybutanol, β-anilinoethanol and benzyl alcohol) ethers (methyl cellosolve, ethyl cellosolve, butyl cellosolve, phenyl cellosolve, methyl carbitol, ethyl carbitol, butyl carbitol, dioxane, diethylene glycol dimethyl ether, diethylene glycol diethyl ether, diethylene glycol dibutyl ether, ethylene glycol dibutyl ether, propylene glycol, dipropylene glycol butyl ether, tripropylene glycol methyl ether and polypropylene glycol methyl ether), ketones (acetone, methyl ethyl ketone, methyl isobutyl ketone, diisobutyl ketone and 4-methyl-1,3-dioxolan-2-one), esters (ethyl acetate, propyl acetate, hexyl acetate, methyl acetate, diethyl succinate, dibutyl oxalate, diethyl maleate. benzyl benzoate, methyl cellosolve acetate, cellosolve acetate and carbitol acetate).

As the surfactant to be added in the developing solution of the present invention, there may be used an anionic surfactant, a nonionic surfactant, a cationic surfactant and an amphoteric surfactant, and specific examples are shown below.

The anionic surfactant may include:
(1) higher alcohol sulfates (e.g. sodium salt of lauryl alcohol sulfate, ammonium salt of octyl alcohol sulfate, ammonium salt of lauryl alcohol sulfate and sodium secondary alkylsulfate)
(2) aliphatic alcohol phosphate salts (e.g. sodium salt of cetyl alcohol phosphate)
(3) alkylarylsulfonates (e.g. sodium dodecylbenzenesulfonate, sodium isopropylnaphthalenesulfonate, sodium dinaphthalenesulfonate and sodium metanitrobenzenesulfonate)
(4) alkylamidesulfonates (e.g.

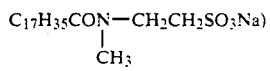

(5) sulfonates of dibasic aliphatic esters (e.g. sodium dioctyl sulfosuccinate and sodium dihexyl sulfosuccinate) and
(6) formaldehyde condensates of alkylnaphthalenesulfonates (e.g. a formaldehyde condensate of sodium dibutylnaphthalenesulfonate).

The nonionic surfactant may include polyoxyethylene alkyl ethers, polyoxyethylene alkylphenol ethers, polyoxyethylene aliphatic acid esters, sorbitan aliphatic acid esters, polyoxyethylene sorbitan aliphatic acid esters. glycerin aliphatic acid esters and oxyethylene oxypropylene block polymers.

The cationic surfactant may include alkylamine salts, quaternary ammonium salts and polyoxyethylenealkylamines.

The amphoteric surfactant may include alkyl betaines. Among these, the anionic surfactants are suitable. These surfactants can be used singly or in combination of two or more kinds.

The amount of the surfactant to be used in the present invention is suitably 0.01% by weight to 60% by weight, preferably 0.1% by weight to 10% by weight.

Further, the surfactant to be used in the present invention is preferably used with an alkali agent, and as said alkali agent, there may be mentioned:
(1) inorganic alkali agents such as sodium silicate, potassium silicate, potassium hydroxide, sodium hydroxide, lithium hydroxide, sodium or ammonium secondary or tertiary phosphate, sodium metasilicate, sodium carbonate and ammonia, and
(2) organic amine compounds such as mono-, di- or trimethylamine, mono-, di- or triethylamine, mono- or diisopropylamine, n-butylamine, mono-, di- or triethanolamine, mono-, di- or triisopropanolamine, ethyleneimine and ethylenediimine.

The amount of the alkali agent to be used is suitably 0.05 by weight to 20% by weight, preferably 0.2% by weight to 10% by weight.

By adding a dye such as Crystal Violet and Astrazone Red to a developing solution, dyeing of an image portion can be carried out simultaneously with development.

Development can be carried out by rubbing with a pad for development impregnated with the developing solution as described above or pouring the developing solution onto the plate surface, followed by rubbing with a brush.

By development as described above, the printing plate in which the light-sensitive layer at the unexposed portion and the silicone rubber are removed, or the printing plate in which the silicone rubber layer is removed to expose the light-sensitive layer, and the silicone rubber layer remains at the exposed portion can be obtained.

EXAMPLES

The present invention is described in detail by referring to Examples, but the present invention is not limited to these Examples.

Synthesis of Diazo resin-1

In 40.9 g of conc. sulfuric acid was dissolved 14.5 g of p-diazodiphenylamine sulfate under ice-cooling. To this reaction mixture was added slowly 1.0 g of paraformaldehyde so that the reaction temperature did not exceed 10° C.

Thereafter, stirring was continued for 2 hours under ice-cooling. This reaction mixture was added dropwise to 500 ml of ethanol under ice-cooling, and the precipitates formed were filtered. After washing with ethanol, the precipitates were dissolved in 100 ml of pure water, and to the solution was added a cold conc. aqueous solution containing 6.8 g of zinc chloride dissolved therein.

The precipitates formed were filtered, washed with ethanol and dissolved in 150 ml of pure water. To the solution was added a cold conc. aqueous solution containing 8 g of ammonium hexafluorophosphate dissolved therein. The precipitates were collected by filtration, washed with water and then dried at 30° C. for 24 hours to obtain Diazo resin-1.

The weight average molecular weight of said diazo resin calculated on styrene obtained by measuring the coupling product with $\beta$-naphthol according to the GPC method was 500.

EXAMPLE 2

On a smooth aluminum plate (H-16) having a thickness of 0.24 mm and degreased by the conventional method was coated the primer layer composition shown below by a wheeler at 60° C., and dried at 100° C. for 2 minutes to form a primer layer. The film thickness after drying was 13 μm.

Primer layer composition

| | |
|---|---|
| (1) Copolymer resin of 2-hydroxyethylmethacrylate and butyl methacrylate with a molar ratio of 30/70 (Mw = 4.0 × 10$^4$) | 100 parts |
| (2) Urethane acrylate UA-306H (trade name, produced by Kyoeisha Yushi K.K.) | 30 parts |

-continued

| | |
|---|---|
| (3) Pentaerythritol tetraacrylate | 30 parts |
| (4) DETX (trade name, produced by Nippon Kayaku K.K.) | 3 parts |

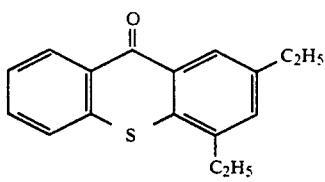

| | |
|---|---|
| (5) EPA (trade name, produced by Nippon Kayaku K.K.) | 3 parts |

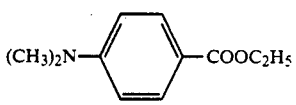

| | |
|---|---|
| (6) KET Yellow 402 (yellow pigment, produced by Dainippon Ink K.K.) | 8 parts |
| (7) Zinc oxide (average particle size: 0.12 μm) | 20 parts |
| (8) Methyl lactate | 600 parts |

The primer layer coated and dried as described above was subjected to exposure by using Unicure (trade name, manufactured by Ushio Denki K. K.) of 160 W at 4 m/min.

Subsequently, on the above primer layer, a light-sensitive composition having the composition shown below was coated and dried at 80° C. for 2 minutes to form a light-sensitive layer having a thickness of 0.3 μm.

Light-sensitive composition

| | |
|---|---|
| (1) Diazo resin-1 | 100 parts |
| (2) Copolymer resin of 2-hydroxyethylmethacrylate, N-(4-hydroxyphenyl)methacrylamide and methacrylicacid with a molar ratio of 40/55/5 (Mw = 4.2 × 10$^4$) | 100 parts |
| (3) Orange IV | 8 parts |
| (4) Methyl lactate | 900 parts |

Subsequently, on the above light-sensitive layer, the silicone rubber composition shown below was coated to have a thickness of 2.0 g/m$^2$, and dried at 100° C. for 4 minutes.

Silicone rubber layer composition

| | |
|---|---|
| (1) Dimethylpolysiloxane having hydroxyl groups at both ends (molecular weight: 52,000) | 100 parts |
| (2) Reactive silane compound shown below | 2.5 parts |
| $\begin{array}{c} O \quad C_3H_6Si(OCH_3)_3 \\ \parallel \quad \mid \\ [-C-N-]_3 \end{array}$ | |
| (3) Dibutyltin laurate | 0.8 part |
| (4) Isopar E (trade name, produced by Esso Chemical) | 900 parts |

Subsequently, on the above silicone rubber layer was laminated a polypropylene film having a thickness of 6 μm to give a light-sensitive litho printing plate requiring no dampening water.

After a positive film was vacuum adhered onto the surface of the above plate material, exposure of 400 mJ/cm$^2$ was effected by using a metal halide lamp as a light source.

Subsequently, after the plate material was dipped in the following developing solution, the surface of the plate material was rubbed with a pad impregnated with the developing solution to obtain a developed printing plate from which the silicone rubber layer and the light-sensitive layer at the unexposed portion were removed.

Developing solution

| | |
|---|---|
| β-Anilinoethanol | 0.5 part |
| Propylene glycol | 1.0 part |
| p-tert-Butylbenzoic acid | 1.0 part |
| Potassium hydroxide | 1.0 part |
| Polyoxyethylene lauryl ether | 0.1 part |
| Potassium sulfite | 2.0 parts |
| Potassium metasilicate | 3.0 parts |
| Water | 91 parts |

Further, the image line portion of the above printing plate was dyed by lightly rubbing the plate surface with a cloth impregnated with a dye solution having the following composition and then washing.

Dye solution

| | |
|---|---|
| Solfit (trade name, produced by Kurare Isoprene Kagaku K.K., solvent) | 20 parts |
| Leodol TW-0120 (trade name, produced by Kao K.K., surfactant) | 0.5 part |
| Benzyl alcohol | 5.0 parts |
| Victoria Pure Blue BOH | 1.0 part |
| Water | 100 parts |

Subsequently, this printing plate was set in a Heidelberg GTO printing machine (trade name, manufactured by Heidelberg) from which a device for feeding dampening water was taken off, and printing was carried out by using a black ink (TOYO KING ULTRA TUK Aqualess G, trade name, produced by Toyo Ink Seizou K. K.).

For the printing plate obtained as described above, tensile strength, hardness and abrasion resistance of the primer layer, and bending resistance of the plate were measured and evaluated according to the following methods.

Tensile strength

For the primer layer thin film used in the present Example, tensile test was carried out by using Tensilon (trade name, manufactured by ORIENTEC CO., LTD.) under constant temperature and constant humidity of 23° C./50% with 70 mm/min, and the values were measured.

Hardness

By using Microvickers hardness tester MHA-400, (trade name, manufactured by NEC), the hardness of the primer layer was measured.

Abrasion resistance

Printing was carried out by using the plated processed by an automatic processor, and evaluation was made in the presence or absence of abrasion stain generated at the non-image line portion of the printed material.

Bending resistance of plate

T bending test (JIS G3312) was carried out, and by observing the surface of the coated film at the bended portion with an optical microscope, presence or absence of abnormalities such as cracks and peel-off was examined. The minimum number of interleaving papers without these abnormalities was examined. As the value is smaller, bending resistance is better The results are shown in Table 1.

EXAMPLE 2

The procedures were carried out in the same manner as in Example 1 except for changing the components (1), (2) and (3) of the primer layer composition in Example 1 to those shown below, and the results in Table 1 were obtained.

| | |
|---|---|
| (1) Copolymer resin of 2-hydroxyethylmethacrylate, methyl methacrylate and ethyl acrylate with a molar ratio of 40/10/50 (Mw = 4.5 × 10$^4$) | 100 parts |
| (2) Pentaerythritol triacrylate | 30 parts |
| (3) DA-314 (trade name, produced by Nagase Kasei K.K.) | 30 parts |

EXAMPLE 3

The procedures were carried out in the same manner as in Example 1 except for changing the components (1), (2) and (3) of the primer layer composition in Example 1 to those shown below, and the results in Table 1 were obtained.

| | |
|---|---|
| (1) Copolymer resin of 2-hydroxyethylmethacrylate and methyl acrylate with a molar ratio of 34/66 (Mw = 5.0 × 10$^4$) | 100 parts |
| (2) Urethane acrylate U-200AX (trade name, produced by Kyoeisha Yushi K.K.) | 20 parts |
| (3) M-8060 (trade name, produced by Toa Gosei Kagaku K.K.) | 40 parts |

COMPARATIVE EXAMPLE 1

The procedures were carried out in the same manner as in Example 1 except for changing the primer layer composition in Example 1 to those shown below, and the results in Table 1 were obtained.

Primer layer composition

| | |
|---|---|
| Lipoxy SP-1509 (trade name, produced by Showa Polymer K.K., bisphenol A type epoxy acrylate) | 100 parts |
| Trimethylolpropanetriethoxytriacrylate | 80 parts |
| 2,4-Diethylthioxantone | 4 parts |
| Ethyl p-dimethylaminobenzoate | 4 parts |
| Propylene glycol monomethyl ether | 600 parts |

COMPARATIVE EXAMPLE 2

The procedures were carried out in the same manner as in Example 1 except for changing the components (1) and (2) of the primer layer composition in Example 1 to those shown below, and the results in Table 1 were obtained.

| | |
|---|---|
| (1) Copolymer resin of 2-hydroxyethylmethacrylate, methyl acrylate and methacrylic acid with a molar ratio of 10/70/20 (Mw = 5.0 × 10$^4$) | 100 parts |
| (2) Pentaerythritol tetraacrylate | 10 parts |

As can be clearly seen from Table 1, in the present samples, both tensile strength and Vickers hardness of the primer layer are excellent, and abrasion is not observed.

Further, it can be seen that bending resistance of the plate is as excellent as 1T, and press life is also remarkably excellent.

TABLE 1

| | Primer layer | | | | |
|---|---|---|---|---|---|
| | Tensile strength (Kg/cm$^2$) | Vickers hardness | Abrasion resistance | Bending resistance of plate | Press life |
| Example 1 | 50 | 45 | Absent | 1T | 120,000 |
| Example 2 | 30 | 24 | Absent | 1T | 120,000 |
| Example 3 | 80 | 31 | Absent | 1T | 125,000 |
| Comparative Example 1 | 5 | 68 | Present | 4T | 80,000 |
| Comparative Example 2 | 10 | 80 | Present | 5T | 75,000 |

In the present invention, by incorporating an ethylenic unsaturated compound and a photopolymerization initiator in a primer layer and also making tensile strength and Vickers hardness of said primer layer 10 Kg/cm$^2$ or more and 70 or less, respectively, a light-sensitive litho printing plate requiring no dampening water improved in abrasion resistance of a silicone rubber layer and bending resistance of a plate, and further excellent in press life can be obtained.

We claim:

1. In a light-sensitive litho printing plate requiring no dampening water having a primer layer, a light-sensitive layer and a silicone rubber layer in this order on a support, the improvement wherein said primer layer is formed by irradiating with ultraviolet radiation, a primer composition containing (1) an ethylenic unsaturated compound having a polymerizable unsaturated group, (2) a photopolymerization initiator for said compound, and (3) a binder; and said primer layer has a tensile strength of 10 Kg/cm$^2$ or more and a Vickers hardness of 50 or less; and wherein said binder is a polymer containing hydroxyl groups.

* * * * *